United States Patent
Wang et al.

(10) Patent No.: US 10,125,431 B2
(45) Date of Patent: Nov. 13, 2018

(54) METHOD OF GROWING GERMANIUM CRYSTALS

(71) Applicant: South Dakota Board of Regents, Pierre, SD (US)

(72) Inventors: Guojian Wang, Vermillion, SD (US); Dongming Mei, Vermillion, SD (US)

(73) Assignee: South Dakota Board of Regents, Vermillion, SD (US)

(*) Notice: Subject to any disclaimer, the term of this patent is extended or adjusted under 35 U.S.C. 154(b) by 22 days.

(21) Appl. No.: 14/900,426

(22) PCT Filed: Jun. 20, 2014

(86) PCT No.: PCT/US2014/043431
§ 371 (c)(1),
(2) Date: Dec. 21, 2015

(87) PCT Pub. No.: WO2014/205360
PCT Pub. Date: Dec. 24, 2014

(65) Prior Publication Data
US 2016/0153117 A1    Jun. 2, 2016

Related U.S. Application Data

(60) Provisional application No. 61/837,886, filed on Jun. 21, 2013.

(51) Int. Cl.
*C30B 15/20* (2006.01)
*C30B 15/28* (2006.01)
(Continued)

(52) U.S. Cl.
CPC .............. *C30B 15/28* (2013.01); *C30B 15/10* (2013.01); *C30B 29/08* (2013.01)

(58) Field of Classification Search
CPC .......... C30B 15/02; C30B 15/20; C30B 29/08
See application file for complete search history.

(56) References Cited

U.S. PATENT DOCUMENTS 2,975,036 A    3/1961  Edwin et al.
3,265,469 A    9/1966  Hall
(Continued)

FOREIGN PATENT DOCUMENTS

CN    101575730 A    11/2009
CN    101736401 A    6/2010
(Continued)

OTHER PUBLICATIONS

Wang et al., "Development of large size high-purity germanium crystal growth", "Journal of Crystal Growth", Jan. 1, 2012, pp. 27-30, vol. 352, Publisher: Elsevier.
(Continued)

*Primary Examiner* — Robert M Kunemund
(74) *Attorney, Agent, or Firm* — Davis, Brown, Koehn, Shors & Roberts, P.C.; Sean D. Solberg

(57) ABSTRACT

In accordance with the present invention, taught is a high purity germanium crystal growth method utilizing a quartz shield inside a steel furnace. The quartz shield is adapted for not only guiding the flow of an inert gas but also preventing the germanium melt from contamination by insulation materials, graphite crucible, induction coil and stainless steel chamber. A load cell provides automatic control of crystal diameter and helps to ensure exhaustion of the germanium melt. The method is both convenient and effective at producing high purity germanium crystals by relatively low skilled operators.

7 Claims, 4 Drawing Sheets

(51) Int. Cl.
*C30B 29/08* (2006.01)
*C30B 15/10* (2006.01)

(56) References Cited

U.S. PATENT DOCUMENTS

| | | | |
|---|---|---|---|
| 3,342,560 | A | 9/1967 | Dietrich et al. |
| 4,258,003 | A | 3/1981 | Hurle et al. |
| 5,948,163 | A * | 9/1999 | Sakurada ............... C30B 15/14 |
| | | | 117/200 |
| 2003/0039865 | A1 * | 2/2003 | Kelsey .................... C03C 3/06 |
| | | | 428/696 |
| 2010/0116196 | A1 | 5/2010 | Liu |

FOREIGN PATENT DOCUMENTS

| | | |
|---|---|---|
| CN | 201713597 U | 1/2011 |
| CN | 102304753 A | 1/2012 |
| CN | 102758250 A | 10/2012 |
| GB | 1494342 | 12/1977 |
| JP | 60 246294 | 12/1985 |

OTHER PUBLICATIONS

Aalseth et al., "Search for an Annual Modulation in a p-Type Point Contact Germanium Dark Matter Detector", "Physical Review Letters", Sep. 30, 2011, pp. 1-5, vol. 107, No. 141301

Ahmed et al., "Dark Matter Search Results from the CDMS II Experiment", "Science", Mar. 26, 2010, pp. 1619-1621, vol. 327.

Anderson et al., "Coherent neutrino scattering in dark matter detectors", "Physical Review D", Jul. 15, 2011, pp. 1-8, vol. 84, No. 013008, Publisher: American Physical Society.

Angloher et al., "Results from 730 kg days of the CRESST-II Dark Matter Search", "The European Physical Journal C", Apr. 12, 2012, pp. 1-22, vol. 72.

Gurriaran et al., "Calibration of a very large ultra-low background well-type Ge detector for environmental sample measurements in an underground laboratory", "Nuclear Instruments and Methods in Physics Research A", Feb. 2, 2004, pp. 264-272, vol. 524.

Hall et al., "High purity germanium for detector fabrication", "General Electric Research and Development Center", , pp. 160-165.

Hansen, "High-Purity germanium crystal growing", "Nuclear Instruments and Methods", Feb. 12, 1971, pp. 377-380, vol. 94, Publisher: North-Holland Publishing Co.

Klapdor-Kleingrothaus et al., "Evidence for Neutrinoless Double Beta Decay", "Modern Physics Letters A", Dec. 5, 2001, pp. 2409-2420, vol. 16, No. 37, Publisher: World Scientific Publishing Company.

Klapdor-Kleingrothaus et al., "Latest results from the Heidelberg-Moscow double beta decay experiment", "The European Physical Journal A", Aug. 22, 2001, pp. 147-154, vol. 12.

Peiffer et al., "Operation of bare HP-Germanium detectors in liquid argo (LAr)", "Nuclear Physics B (Proceeding Supplements)", Jan. 1, 2005, pp. 511, vol. 143.

Wilkerson et al., "The Majorana Demonstrator: A Search for Neutrinoless Double-beta Decay of Germanium-76", "Journal of Physics: Conference Series", Jan. 1, 2012, vol. 375, No. 042010, Publisher: IOP Publishing.

Yue, "The application of high purity germanium detector in particle and astroparticle physics (in Chinese)", "Science Sinica: Phys, Mech & Astron", Jan. 1, 2011, pp. 1434-1440, vol. 41, Publisher: Science China Press.

* cited by examiner

METHOD OF GROWING GERMANIUM CRYSTALS

This application claims the benefit under 35 U.S.C. § 371 to International PCT Patent Application No. PCT/US2014/043431, filed on Jun. 20, 2014, which claims priority to U.S. Patent Application 61/837,886, filed Jun. 21, 2013, both of which are hereby incorporated herein in their entireties by this reference.

GOVERNMENT SUPPORT

This invention was made with government support under Grant No. DE-FG02-10ER46709 awarded by the Department of Energy. The government has certain rights in the invention.

BACKGROUND OF THE INVENTION

1. Field of Invention

The present invention relates generally to a method for the growth of germanium crystals and, more particularly, to a modified Czochralski method using a quartz shield for growing high purity germanium (HP-Ge) crystals in load cell controlled stainless steel furnace. More particularly the present invention relates to the automatic diameter control of high purity germanium crystals between 3 cm and up to at least 15 cm in diameter.

2. Description of the Prior Art

Germanium-based experiments have recently reported a possible dark matter signature (CoGeNT) [1] and have claimed discovery of neutrinoless double beta decay [2, 3] making germanium a preferred target for use in future experiments. Five research groups, Super-CDMS, CRESST, GERDA, MAJORANA, CDEX [4-9], are working to detect dark matter utilizing large-scale HP-Ge crystal detectors with ultra-low internal radioactive backgrounds. The sensitivity of the germanium-based experiment is related to the size of HP-Ge crystals. Large diameter (>3 inch) HP-Ge crystals have higher sensitivity and supply a bigger volume for collecting the signal, especially from weakly interacting massive particles (WIMP).

For HP-Ge crystals, the impurity level should be lower than $2 \times 10^{10}$ $cm^{-3}$ and the local density of dislocation is in the range of $10^2$-$10^4$/$cm^2$. Currently, the HP-Ge single crystal used for the largest HP-Ge detectors weighs 4.8 kg and is Ø10×12 $cm^2$ [10]. It is tremendously difficult to grow such big HP-Ge-detector grade crystals. In the 1970s, HP-Ge crystal growth with diameters in the range of 2~3.5 cm was discussed [11, 12]. However, from then on, there has been less work focused on the research of crystal growth, especially for large size (>6 cm in diameter) crystals.

High purity germanium crystals (13N) were grown by the Czochrolski method in a hydrogen atmosphere. Usually, it is grown in a quartz tube crystal grower (W. L. Hansen, Nuclear Instruments and Methods, 94(1971)377-380). A graphite crucible was located at the outside of quartz crucible to absorb the radio frequency wave to generate heat to melt the germanium ingot. Ceramic insulation was used to keep the thermal field stable. The insulation and graphite crucible must be very pure, otherwise, when the temperature of graphite crucible goes to the melt point of germanium, some phosphorus, arsenic or boron oxides in the insulation materials and graphite crucible will react with hydrogen and introduce n- or p-type contamination into the germanium melt and make the purity of the crystal decrease. The highly pure insulation and graphite crucible represent huge cost.

Another deficiency is that this kind of design is difficult to operate during loading of raw materials into the quartz crucible and in taking the crystal out. Many companies still use this kind of design to grow HP-Ge crystals. Large size detector grade crystal needs large quartz tube furnaces. This is the reason why the largest size HP-Ge crystals are only 4 inches (100 mm) in diameter. This is one of the reasons why the price of HP-Ge crystals is about ten times of germanium ingot.

Stainless steel furnaces are used to grow electric grade and infrared grade germanium crystals. The fabrication technology of stainless steel furnaces for the Czochralski (CZ) method crystal growth is very mature and the automatic control of it is very accurate.

Stainless steel furnaces can get a very high vacuum (>$10^{-6}$ Torr), which is very important for decreasing the $SiO_2$ precipitation in HP-Ge crystals. The stainless steel furnace is very safe to operate with $H_2$ gas and can grow large size germanium crystals. They are currently able to grow infrared grade germanium crystals up to a size of 300 mm. Generally, people in the art believe that the stainless steel chamber will introduce contaminations, which is likely the reason no company currently uses a stainless steel furnace to grow HP-Ge crystals.

A further obstacle is the degree of training and skill of the human operators of the traditional CZ methods required to produce large, high quality crystals. Indeed, one limitation in this technology is the limited number of people with adequate training and skill. A method is needed, which will allow operators of relatively low skill to produce large, high quality crystals.

BRIEF SUMMARY OF THE INVENTION

In accordance with the present invention, we teach an HP-Ge crystal growth method comprising a quartz shield for isolating the germanium melts that otherwise may be contaminated by the stainless steel chamber, insulation materials, and/or graphite crucible of a stainless steel furnace. We also teach use of a load scale for controlling the crystal diameter and to ensure exhaustion of all melt from the crucible. With the disclosed apparatus and method, operators with only a few months of training are able to produce HP-Ge crystals as large or larger than those commercially available.

The primary objective of the present invention is to provide an HP-Ge crystal growth method wherein the crystal growth is carried out in a high pure silica crucible shielded by quartz with an inert gas flow so that the contaminations from stainless chamber, insulation materials and graphite crucible are prevented from entering the crystal.

The dislocation density in the grown crystals was measured using an optical microscope and was determined to be between about $1 \times 10^3$ and $4 \times 10^3$/$cm^2$, which falls in the required range for a high-purity germanium detector. X-ray diffraction tests on the surfaces indicate the grown crystals are of high quality.

Another objective of the present invention is to provide an HP-Ge crystal growth method wherein a stainless steel chamber is used to grow HP-Ge crystal under a very high vacuum (>$10^{-6}$ Torr) which is safe for operating under a highly pure hydrogen atmosphere.

A further objective of the present invention is to provide an HP-Ge crystal growth method wherein the operations of the loading germanium ingot and taking out the crystal are more convenient than that of the conventional crystal growth methods.

A further objective of the present invention is to provide an HP-Ge crystal growth method that has a lower price.

A further objective of the present invention is to provide an HP-Ge crystal growth method that has crystals whose mass and size can reach 15 kg and 15 cm in diameter and has a higher quality.

Yet another object of the present invention is to provide a method and apparatus for making HP-Ge crystals by relatively low skilled operators.

Further benefits and advantages of the present invention will become apparent after a careful reading of the detailed description with appropriate reference to the accompanying drawings.

DISCLOSURE OF INVENTION

It is an object of the present invention to use a stainless steel furnace and provide a quartz shield designed to isolate the germanium melt from contaminations that are a common problem in the art, such as phosphorus (P), arsenic (As), boron (B), and the like, which may come from the stainless steel chamber and insulations.

Figure 1:
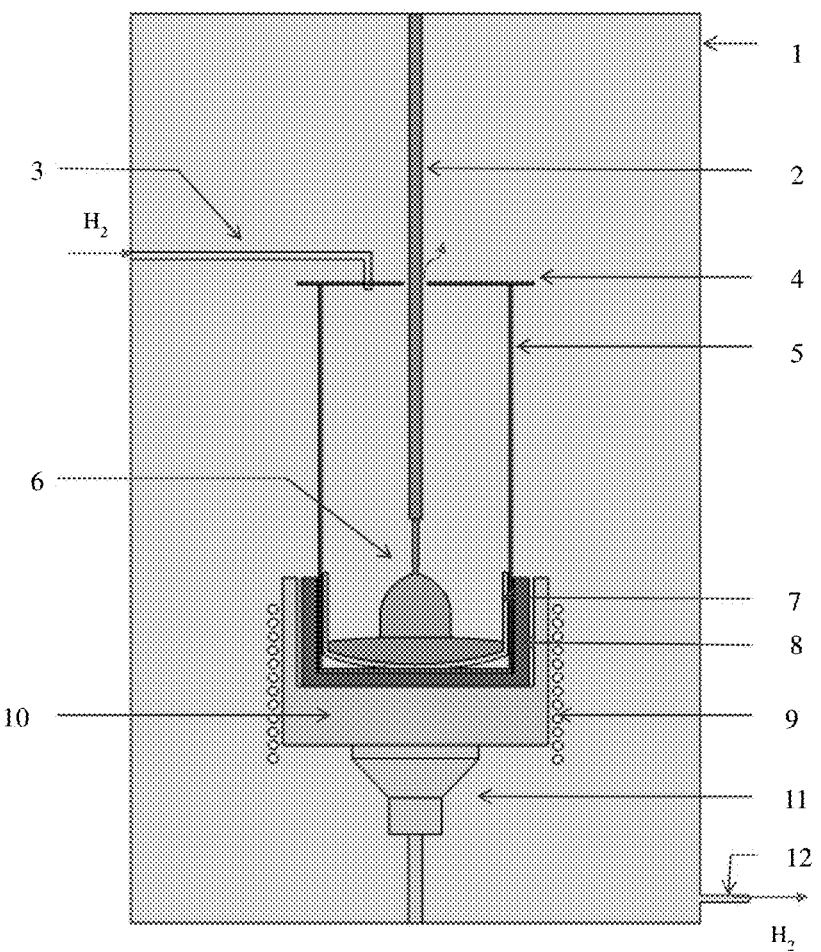
FIG. 1 is schematic figure of a crystal growing furnace of the present invention.
Figure 2A:
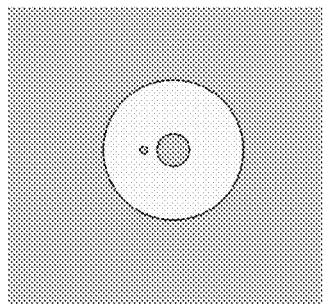
FIG. 2 is schematic figure of a quartz lid and quartz tube of the present invention.
Figure 2B:
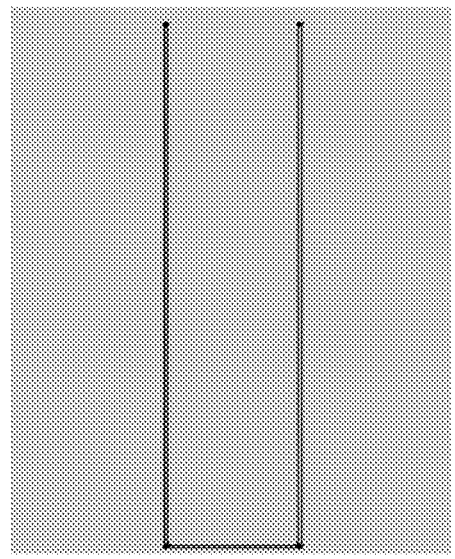

In a preferred embodiment, a stainless steel furnace is modified to practice the method. Located inside a stainless steel chamber 1 of the furnace is a quartz shield consisting of a quartz tube 5 topped by a quartz lid 4 (FIG. 1). Inside the quartz shield is a silica crucible 7 which contains molten germanium from which a germanium crystal 6 is drawn by a seed shaft 2 that extends downwardly through an aperture in the quartz lid 4. An inert gas, preferably hydrogen, flows into the quartz shield from an inlet pipe 3, out into the steel chamber 1 thorough aperture 4 and is exhausted through outlet pipe 12. The bottom section of the quartz shield is enclosed by a graphite crucible 8 which in turn is surrounded by insulation 10. A radio frequency (RF) coil 9 partially surrounds the graphite crucible 8 to adjustably heat the germanium. The RF coil 9, insulation 10, graphite crucible 8, quartz shield, silica crucible 7 and molten germanium are all supported on a supporter 11. A load scale (not shown) monitors the weight of the growing crystal.

In operation, the steel chamber 1 is evacuated down to $10^{-6}$ Torr. Highly pure $H_2$ is then injected through inlet pipe 3 at a pressure between 2~6 PSI and a flow rate of between 50~250 l/h. The hydrogen flow can prevent the contaminations going into the quartz tube 5. The contaminations such as P, As, B, etc., from the stainless steel chamber 1 and insulations will be isolated from the germanium melt by the quartz shield and $H_2$ flow. Therefore, the purity of germanium crystal will be preserved. The graphite crucible 8 is heated by the RF induction coil 9 to melt the germanium ingot and the crystal growth process is started. A pulling rate of between 50 to120 mm/h and any value within such range is used. A rotation rate of between 5 to 30 rpm and any value within such range is used. An axial thermal gradient of between 10 to 40 K/cm and any value within such range is used. The load cell is used to control the crystal growth process according to a software control. Preferably, the molten germanium has a net carrier concentration between about $10^9$ and about $10^{13}$ cm$^{-3}$.

In accordance with the present invention, we provided a HP-Ge crystal growth method, comprising a quartz shield for HP-Ge crystal growth by in a load cell controlled stainless steel furnace and automatic diameter control of between about 3 cm and about 15 cm in diameter HP-Ge crystal growth.

In a preferred embodiment, a load cell with sensitivity ±0.01 g is placed in line with the seed shaft 2 to which the seed crystal 6 is attached. As the crystal 6 is pulled from the melt, the change in weight is used to generate a control signal that modifies the RF generator output power to the crucible, thereby controlling the diameter through small changes in the melt temperature. FIG. 3 shows the typical relationship between crystal weight and RF generator power for Ø3 and Ø9 cm crystals, respectively. The balance or load cell shows the weight of grown crystal and makes it easy to exhaust the melt to avoid the left-over melt breaking the silica crucible. When the last melt drop is solidified, this solidified drop will touch the crucible. Before this happens, very fast pulling speed (typically 2 cm/min) should be applied, otherwise, the seed will be broken and the crystal will drop down.

The crystal diameter is calculated from the formula:

$$d = \sqrt{\frac{4 \cdot dw/dt}{\frac{dw/dt \cdot \rho_s}{R^2 \cdot \rho_l} + p \cdot \pi \cdot \rho_s}} \quad (1)$$

where dw/dt is the rate of change of weight, $\rho_s$ the solid density, $\rho_L$ the liquid density, R the crucible radius and P the pull speed. FIG. 4 shows the calculated crystal diameter for Ø3 and Ø9 cm crystals basing on the change in weight of the crystal growth process. After the crystals taken out from the furnace, the crystal's diameter was measured by calipers (as shown in FIG. 4). The results of experiments and measurements are in good agreement, such that Equation (1) can be used to monitor the crystal diameter in crystal growth process. This makes it possible for the automatic control in high purity germanium crystal growth.

After crystal growth, the supporter 11 will move down and the seed shaft 2 with crystal 6 will be pulled up. When the crystal 6 with the quartz lid 4 exits the quartz tube 5, the crystal 6 is held by hand and the neck is cut. Then the crystal 6 is taken out of the furnace.

The present invention will be explained in more detail with reference to examples and comparative examples, but the present invention is not restricted thereto.

EXAMPLE 1

Figure 3A:
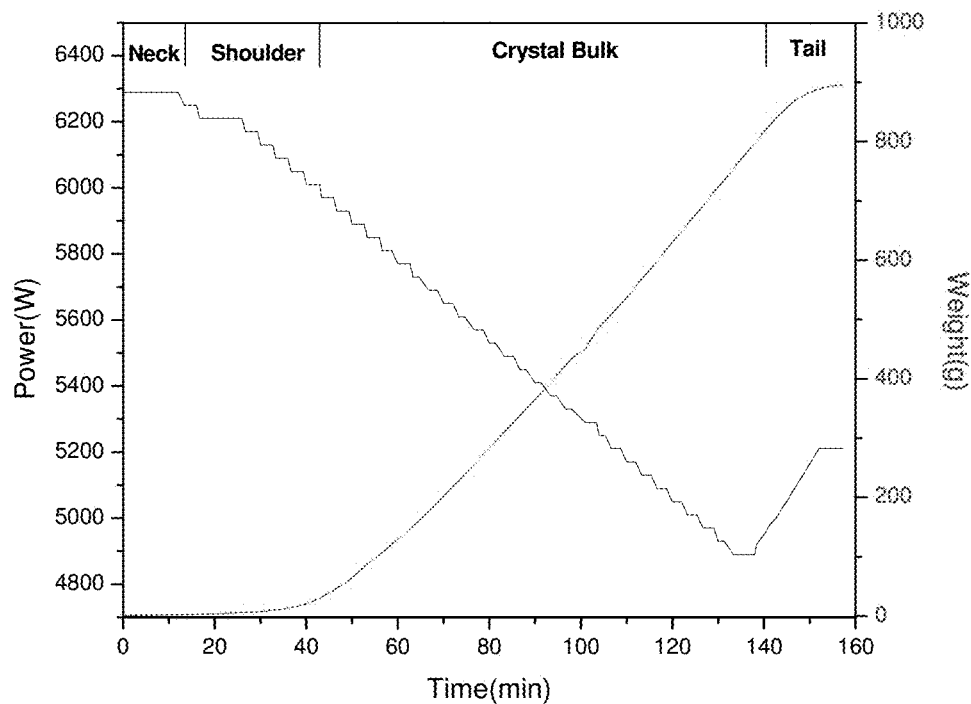
FIGS. 3(a) and (b) are graphical representations of the changes in the relationship between weight and power over time for a Ø3 crystal and a Ø9 crystal, respectively.
Figure 4A:
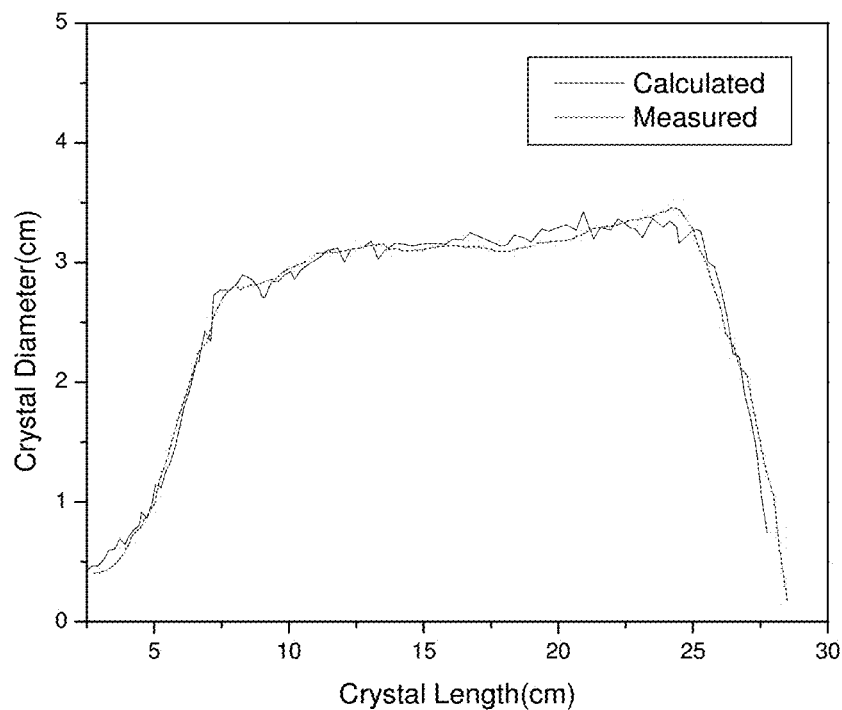
FIGS. 4(a) and (b) are graphical representations of the crystal diameter and length for obtained Ø3 crystal and obtained Ø9 crystal, respectively.
Figure 4B:
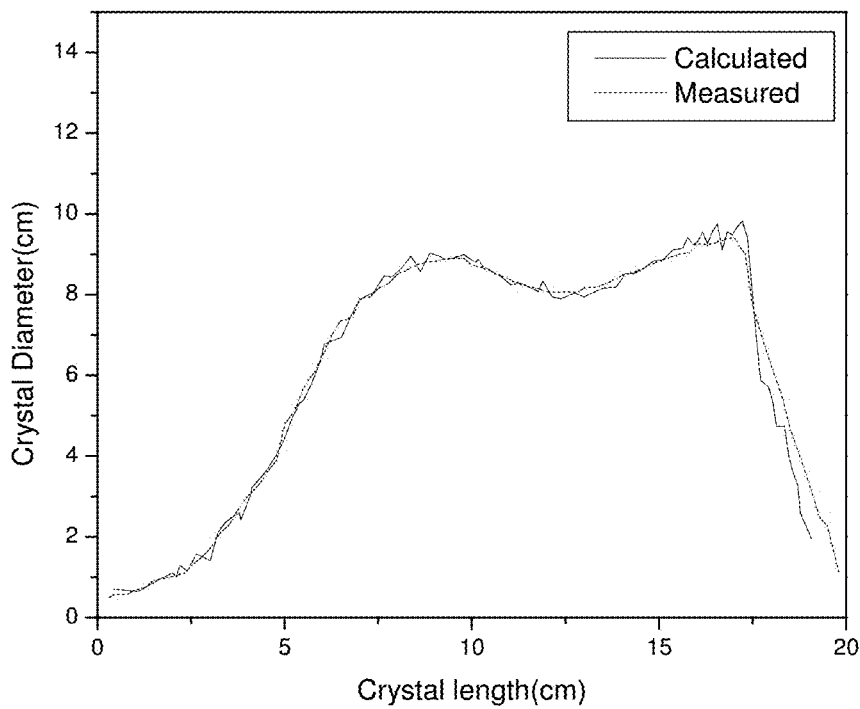

The pulling apparatus shown in FIG. 1 was filled with a germanium raw material of 900 g into a quartz crucible 7 having an inner diameter 70 mm. The diameter and length of quartz tube 5 is 90 mm and 450 mm, respectively. The hydrogen flow rate was 80 L/h. The raw materials were melted by radio frequency (20 KHz) power. Then the crystal growth was controlled as shown in FIG. 3(a). The crystal weight was used to control the crystal diameter and the exhaustion of melt. The measured diameter and the calculated diameter from Equation (1) of the grown crystal are shown in FIG. 4(a).

EXAMPLE 2

Figure 3B:
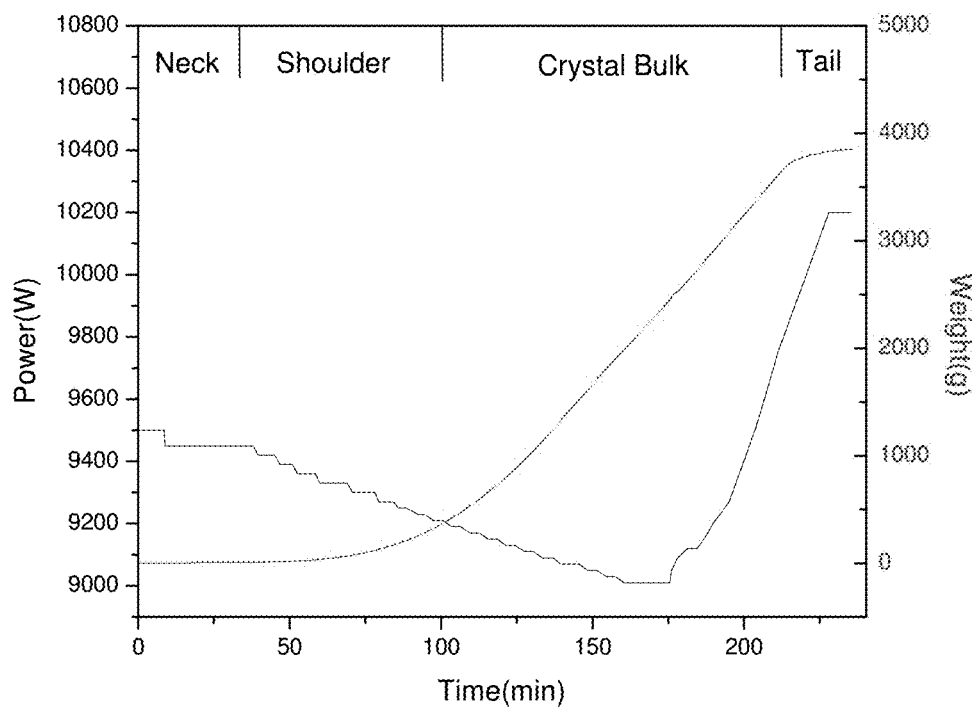

The pulling apparatus shown in FIG. 1 was filled with a germanium raw material of 4000 g into a quartz crucible having an inner diameter 180 mm The diameter and length of quartz tube 5 was 220 mm and 450 mm, respectively. The hydrogen flow rate was 100 L/h. The raw materials were melted by radio frequency (20 KHz) power. Then the crystal growth was controlled as shown in FIG. 3(b). The crystal weight was used to control the crystal diameter and the exhaustion of melt. The measured diameter and the calculated diameter from Equation (1) of the grown crystal were shown in FIG. 4(b).

The foregoing description and drawings comprise illustrative embodiments of the present inventions. The foregoing embodiments and the methods described herein may vary based on the ability, experience, and preference of those skilled in the art. Merely listing the steps of the method in a certain order does not constitute any limitation on the order of the steps of the method. The foregoing description and drawings merely explain and illustrate the invention, and the invention is not limited thereto, except insofar as the claims are so limited. Those skilled in the art that have the disclosure before them will be able to make modifications and variations therein without departing from the scope of the invention.

REFERENCES

[1] C. E. Aalseth, et al. (CoGeNT Collaboration), Phys. Rev. Lett. 107(2011)141301-1-141301-5.
[2] H. V. Klapdor-Kleingrothaus, A. Dietz, H. L. Harney, I. V. Krivosheina, Mod. Phys. Lett. A, 16 (2001) 2409-2420.
[3] H. V. Klapdor-Kleingrothaus, A. Dietz, L. Baudis, G. Heusser, I. V. Krivosheina, B. Majorovits, H. Paes, H. Strecker, V. Alexeev, A. Balysh, A. Bakalyarov, S. T. Belyaev, V. I. Lebedev, S. Zhukov, Eur. Phys. J. A 12 (2001)147-154.
[4] Z. Ahmed et al. (CDMS Collaboration), Science 327 (2010)1619-1621.
[5] G. Angloher et al. (CRESST Collaboration), Eur. Phys. J. C., 72 (2012) 1971-1-1971-22.
[6] A. J. Anderson, J. M. Conrad, E. Figueroa-Feliciano, K. Scholberg, J. Spitz, Phys. Rev. D, 84(2011) 013008-1-013008-8
[7] P. Peiffer, D. Motta, S. Schoenert, H. Simgen, Nucl. Phys. B 143(2005)511.
[8] A. G. Schubert et al. (Majorana Collaboration), Journal of Physics: Conference Series, 375(2012)042010.
[9] Q. Yue, Scientia Sinica Phys, Mech & Astron, 41(2011) 1434-1440.
[10] R. Gurriaran, E. Barker, P. Bouisset, X. Cagnat and C. Ferguson, Nucl. Instr. Meth. A524(2004) 264-272.
[11] W. L. Hansen, Nucl. Instr. and Methods 94(1971)377-380.
[12] R. N. Hall and T. J. Soltys, IEEE Trans. Nucl. Sci. NS-18(1971)160-165.

We claim:

1. A method of growing high purity germanium crystals, comprising the steps of:
    (a) isolating a first crucible containing molten germanium inside a melt container comprising a quartz shield having a removable lid;
    (b) locating said melt container inside a furnace for controlling the temperature of said germanium;
    (c) passing an inert gas through said melt container;
    (d) controlling the diameter of a crystal of germanium drawn from said first crucible at a rate controlled by a load scale that monitors the weight of the crystal; and
    (f) removing the lid from the quartz shield to permit withdrawl of the germanium crystal from the melt container.

2. The method of claim 1, wherein said molten germanium has a net carrier concentration between about $10^9$ and about $10^{10}$ cm$^{-3}$.

3. The method of claim 1, wherein said quartz shield includes a quartz lid and a quartz tube.

4. The method of claim 3, further comprising a graphite crucible and wherein the quartz tube is located between the graphite crucible and said first crucible.

5. The method of claim 1, wherein said inert gas is hydrogen and the flow rate is between about 50 and about 250 L/h.

6. The method of claim 1, wherein a weigh signal from the load scale is used to modify the temperature of the molten germanium to control the crystal diameter and the exhaustion of all the melt.

7. The method of claim 1, wherein said crystal of germanium has a dislocation density of between about $10^2$ and about $10^4$ cm$^{-2}$.

* * * * *